(12) United States Patent
Lee

(10) Patent No.: US 7,280,398 B1
(45) Date of Patent: Oct. 9, 2007

(54) SYSTEM AND MEMORY FOR SEQUENTIAL MULTI-PLANE PAGE MEMORY OPERATIONS

(75) Inventor: June Lee, San Jose, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/514,746

(22) Filed: Aug. 31, 2006

(51) Int. Cl.
*G11C 11/34* (2006.01)

(52) U.S. Cl. .................... 365/185.11; 365/185.33; 365/185.23; 365/185.05; 365/230.03

(58) Field of Classification Search ........... 365/185.11, 365/185.33, 185.23, 185.05, 230.03
See application file for complete search history.

(56) References Cited

U.S. PATENT DOCUMENTS

| | | | | |
|---|---|---|---|---|
| 5,337,275 | A | * | 8/1994 | Garner .................. 365/189.01 |
| 5,341,330 | A | * | 8/1994 | Wells et al. ........... 365/185.33 |
| 5,519,847 | A | * | 5/1996 | Fandrich et al. ............ 711/169 |
| 5,577,194 | A | * | 11/1996 | Wells et al. .................... 714/8 |
| 5,914,902 | A | * | 6/1999 | Lawrence et al. ........... 365/201 |
| 6,081,878 | A | | 6/2000 | Estakhri et al. ............. 711/168 |
| 6,101,150 | A | * | 8/2000 | Roohparvar ........... 365/230.06 |
| 6,208,556 | B1 | | 3/2001 | Akaogi et al. ......... 365/185.11 |
| 6,304,510 | B1 | * | 10/2001 | Nobunaga et al. ..... 365/230.06 |
| 6,538,926 | B2 | | 3/2003 | Kato et al. ............. 365/185.28 |
| 6,580,659 | B1 | * | 6/2003 | Roohparvar ................ 365/233 |
| 7,032,065 | B2 | | 4/2006 | Gonzalez et al. ........... 711/103 |
| 2005/0141313 | A1 | | 6/2005 | Gorobets et al. ........... 365/222 |
| 2006/0218359 | A1 | | 9/2006 | Sanders et al. ............. 711/154 |

OTHER PUBLICATIONS

Hynix, "16Gb NAND Flash HY27UH08AG(5/D) M Series 16Gbit, (2G×8bit) NAND Flash", Sep. 2006. pp. 1-54.
Lee, J. et al., "High-Performance 1-Gb NAND Flash Memory with 0.12-μm Technology", IEEE Journal of Sold-State Circuits, vol. 37, No. 11, Nov. 2002. pp. 1502-1509.
Micron Technology, Inc. "NAND Flash Memory MT29F4G08AAA, MT29F8G08DAA, MT29F16G08FAA", 2006. pp. 1-79.
Samsung Electronics Co, LTD., "Flash Memory K9XXG08UXA", Nov. 2005. pp. 1-50.

* cited by examiner

*Primary Examiner*—Viet Q. Nguyen
(74) *Attorney, Agent, or Firm*—Dorsey & Whitney LLP

(57) ABSTRACT

A system and method for performing memory operations in a multi-plane flash memory. Commands and addresses are sequentially provided to the memory for memory operations in memory planes. The memory operations are sequentially initiated and the memory operation for at least one of the memory planes is initiated during the memory operation for another memory plane. In one embodiment, each of a plurality of programming circuits is associated with a respective memory plane and is operable to program data to the respective memory plane in response to programming signals and when it is enabled. Control logic coupled to the plurality of programming circuits generates programming signals in response to the memory receiving program commands and further generates programming enable signals to individually enable each of the programming circuits to respond to the programming signals and stagger programming of data to each of the memory planes.

18 Claims, 4 Drawing Sheets

SYSTEM AND MEMORY FOR SEQUENTIAL MULTI-PLANE PAGE MEMORY OPERATIONS

TECHNICAL FIELD

Embodiments of the invention relate generally to memory devices having multiple plane memory arrays, and more specifically, to interleaved and overlapping memory operation of the multiple memory planes.

BACKGROUND OF THE INVENTION

Conventional NAND flash memories typically multiplex input/output (I/O) lines for receiving command, address, and data signals. Some commands, such as a program (i.e., write) command, require all three different types of information to be provided to the memory device. That is, in order to program memory cells with new data, a program command is issued, then the addresses of the memory cells that will be programmed are provided, and finally, data to be programmed are provided. A confirmation command is typically issued after the data are provided to the memory indicating the end of the command. All of this information is provided to the memory using the same I/O lines.

Control signals are used to differentiate the types of signals when latching the different information into the memory. For example, typical control signals command latch enable (CLE) and address latch enable (ALE) signals are brought to a HIGH logic level to indicate to the memory device that the signals that will be latched in response to the next rising edge of a write enable (WE#) signal are either a command or an address, respectively. Thus, when the CLE signal is HIGH (and the ALE signal is LOW), the signals latched from the I/O lines in response to a rising edge of the WE# signal represent a command. In contrast, when the ALE signal is HIGH (and the CLE signal is LOW), the signals latched from the I/O lines in response to a rising edge of the WE# signal represent an address. When both the CLE and ALE signals are LOW, the signals latched from the I/O lines in response to a rising edge of the WE# signal represent data.

In programming data to the memory, the time for the program operation to complete can be divided into three general time ranges: (1) command and address writing time, (2) data loading time, and (3) programming time. Using an example of a write cycle time tWC of 35 ns (i.e., the period of the WE# signal), command and address writing time can be about 245 ns (i.e., 7×35 ns), programming time about 150 us, and assuming that data for a full page is being loaded (further assuming a 2 kbyte page and byte-wide I/O lines), 71.7 us (i.e., 35 ns×2 kbytes) for the data loading time. As illustrated by the present example, the command and address writing time is nearly negligible, but the data loading time can be almost one-third of the total time for the program operation to complete.

One approach that has been taken in improving programming bandwidth of flash memory is through multi-plane page programming. As known, a memory array of flash memory cells is often divided into a plurality of memory "planes," for example, one memory may have a memory array divided into two memory planes, or for another memory, the memory array is divided four separate memory planes. In a multi-plane page programming operation, data are sequentially loaded to data registers for each of the memory planes, and the loaded data are then programmed to the memory planes simultaneously. In this manner, the program time, which is generally the same if one page of memory is programmed or multiple pages for multiple memory planes (one page per memory pane) are programmed, is shorter compared to sequentially programming multiple pages for multiple memory panes. A disadvantage, however, is that loading data to the data registers can take considerable time, especially in the case where full pages of data are being written for each of the memory planes.

An improvement to multi-plane programming is combining multi-plane programming with a secondary cache register, which is included in the memory in addition to the data register. Data to be programmed are initially loaded to a cache register. The data are then moved to a data register and programming of the data now in the data register begins. After programming has begun, new data can be loaded to the cache register in preparation for programming upon completion of programming the previous data. As applied to multi-page programming, data are sequentially loaded to the cache registers associated with the different memory planes. Upon completion of data loading for each of the memory planes, the data are simultaneously copied from the cache registers to the respective data registers and simultaneous memory plane programming begins. During programming, new data can be sequentially loaded for programming to the memory planes into the respective cache registers. When programming of the previous data are complete, the new data for all of the memory planes are moved from the cache registers to the respective data registers, and simultaneous programming of the new data is begun. The cache registers allows some of the data loading time to be "hidden" since data can be loaded during the time data are being programmed to the memory planes. In contrast, in multi-page programming without cache registers (i.e., using only data registers), loading of new data to be programmed cannot begin until programming of the previous data is completed.

A disadvantage of cache multi-page programming is that considerable layout area is used for the cache registers. Each of the cache registers for the memory planes is typically the same size as the corresponding data registers. As a result, the layout area devoted to registers is doubled where cache registers are included. As a result, although programming bandwidth for cache multi-page programming is improved over non-cache multi-page programming, layout area is sacrificed to provide this feature. In applications where miniaturization is a priority, doubling the layout area occupied by registers is undesirable.

DETAILED DESCRIPTION OF PREFERRED EMBODIMENTS

The invention includes embodiments of memory systems having multiple memory planes in which portions of a command sequence and corresponding memory operations for the memory planes can be overlapped. Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
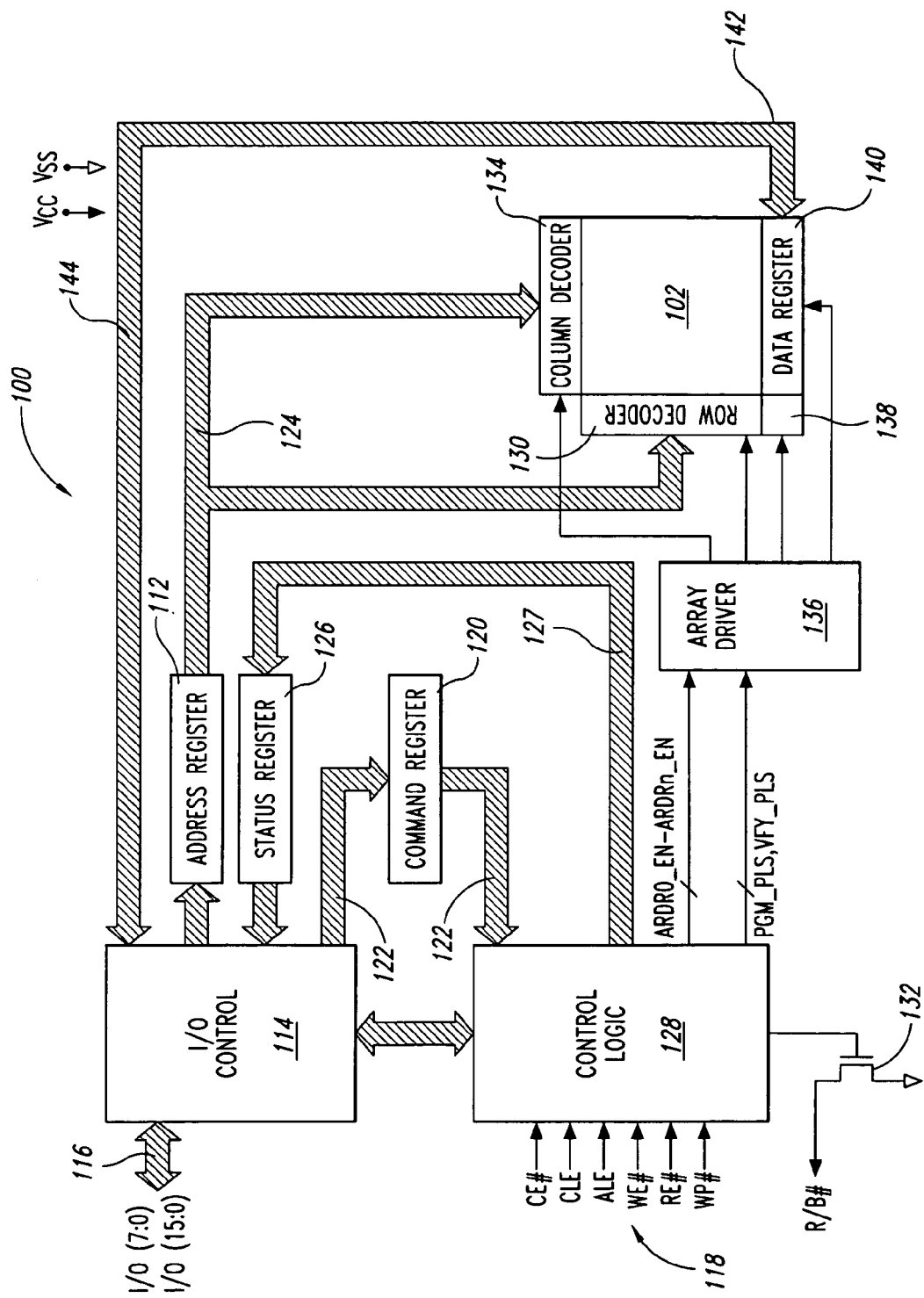
FIG. 1 is a block diagram of a NAND flash memory in which an embodiment of the invention is implemented.

FIG. 1 is a simplified block diagram of a portion of a flash memory 100 according to an embodiment of the present invention. As shown in FIG. 1, the memory 100 has been simplified to focus on features of the memory that are helpful in understanding the present invention. A more detailed understanding of internal circuitry and functions of flash memories are known to those skilled in the art. The memory 100 includes a memory array 102 having a plurality of memory cells arranged in rows and columns. Each of the memory cells includes a floating-gate field-effect transistor capable of holding a charge for the non-volatile storage of data. The cells can be electrically programmed by charging the floating gate. The rows of memory array 102 are arranged in blocks, where a memory block is some discrete portion of the memory array 102. The memory cells generally can be erased in blocks. Data, however, may be stored in the memory array 102 in finer increments than a memory block.

Row decoder and column decoder circuits 130, 134 decode memory addresses to access the corresponding memory locations in the memory array 102. Data register 140 temporarily stores data read from, or to be programmed to the memory array 102. A program driver 138 is coupled to the memory array 102 for programming data to the memory cells. As will be described in more detail below, the memory array 102 is divided into multiple memory planes (not shown in FIG. 1), each of which is associated with respective row and column decoders, data register, and program driver. As known, the memory planes of memory array 102 can be physically divided by layout of the separate memory planes, as well as logically divided by the mapping of memory addresses to different memory planes.

Command, data and address signals are provided to an I/O control 114 on device bus 116, which is multiplexed for receiving the various signals. Which of the various signals are being received is determined by control signals 118 provided to a control logic 128. In response to control signals 118 indicating that command signals are being provided on the device bus 116 to the I/O control 114, the command signals are received by the I/O control 114 and the corresponding commands are latched by a command register 120. The latched command is provided to the control logic 128 via internal command bus 122, where the commands are decoded and corresponding internal control signals are generated by the control logic 128 to perform the requested memory operations. In response to the control signals 118 indicating that address signals are being provided on the device bus 116 to the I/O control 114, the address signals are received and the corresponding addresses are latched in an address register 112. A status register 126 is used to latch status information provided to it over an internal status bus 127 from the control logic 128. The status information is generated by the control logic 128 in response to receiving a command requesting the status of an operation. The control logic 128 is coupled to a transistor 132 to provide a ready/busy signal R/B# that can be used for indicating the completion of various memory operations. The signal is typically HIGH, and transitions to LOW after a command is written to the device. When the memory is ready to receive the next command, the R/B# signal transitions back to HIGH.

An array driver 136 is coupled to the control logic 128 to receive enable signals ARDR0_EN-ARDR3_EN and further receive control signals. The array driver 136 is coupled to the row and column decoders 130, 134, the program driver 138, and the data register 140 to control operation thereof in response to the control signals. Included in the array driver control signals are program and verify pulse signals PGM_PLS, VFY_PLS, as shown in FIG. 1, that are used by the array driver 136 for programming data to the memory array 102. As known, other signals may be included in the control signals provided by the control logic 128 to the array driver 136, but have not been shown in FIG. 1 in order to simplify description of the flash memory 100.

In operation, the memory array 102 can be accessed by providing a combination of control, command, and address signals. For example, to perform a read operation, a first combination of control signals 118 is provided to the control logic 128 to indicate that command signals are applied to the device bus 116. The control logic 128 generates internal control signals for the I/O control 114 to receive the command signals and for the corresponding command to be latched in the command register 120. The control logic 128 decodes the read command and begins to generate internal control signals for accessing the memory array 102.

A second combination of control signals 118 is provided to the control logic 128 to indicate that address signals are applied to the device bus 116. The control logic generates internal control signals for the I/O control 114 to receive the address signals and for the corresponding addresses to be latched in the address register 112. The addresses are provided to a row decoder circuit 130 and a column decoder circuit 134 via an internal address bus 124 for decoding the addresses and accessing the memory locations corresponding to the latched addresses. A page of memory cells having the memory locations to be accessed is read from the memory array 102 and stored in a data register 140. The data from the page of memory are transferred to the I/O control 114 from the cache register 142. Based on the addresses, the appropriate data from the page of data are output on the device bus 116.

A write operation occurs in a similar manner except that following the second combination of control signals a third combination of control signals are provided to the control logic 128 indicating that data to be written to the memory locations corresponding to the addresses are being provided on the device bus 116. The data received by the I/O control 114 are provided on the internal data bus 144 to the data register 140 for writing to the memory array 102.

Figure 2:
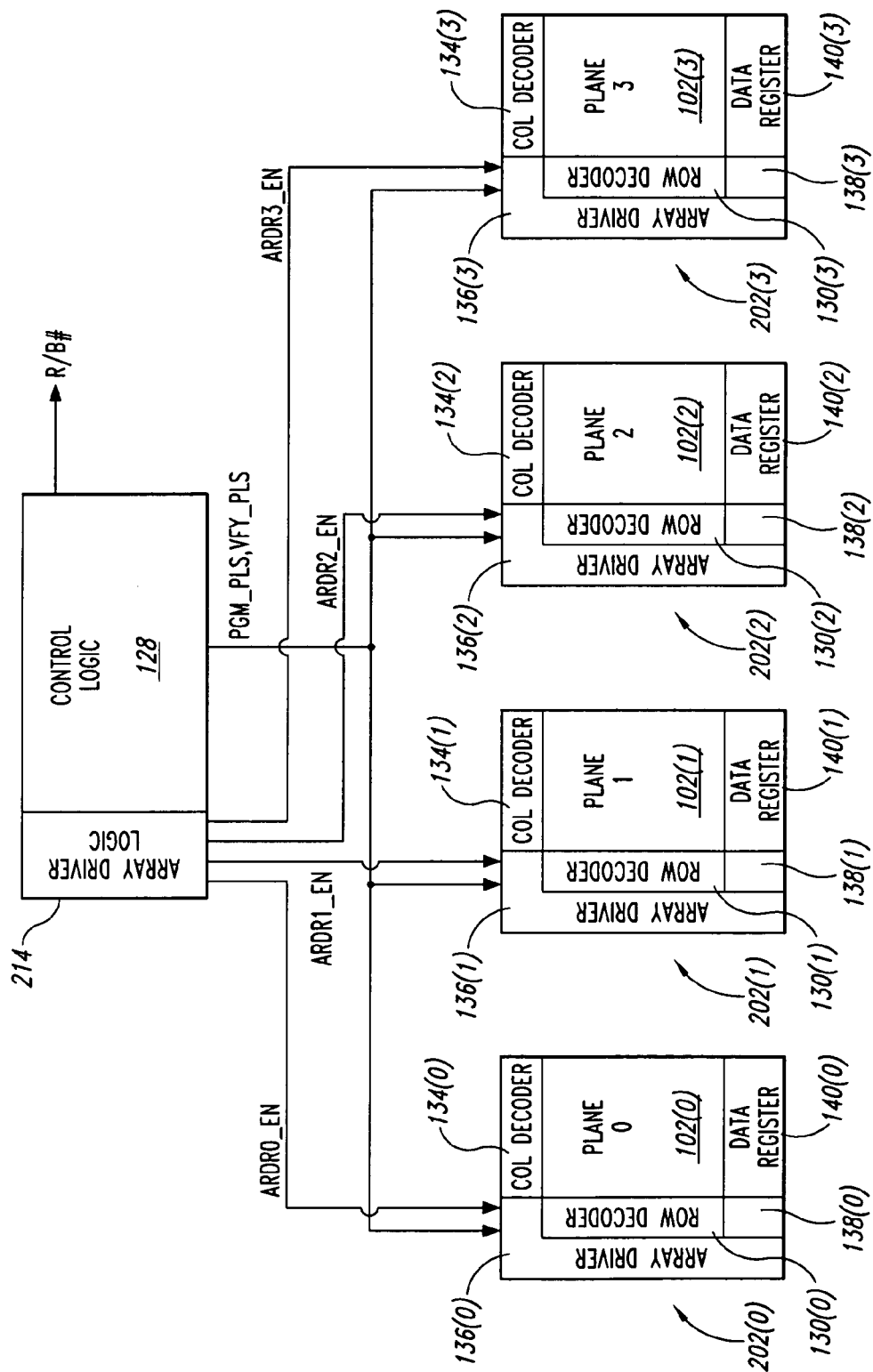
FIG. 2 is a block diagram of multiple memory planes and a portion of the NAND flash memory of FIG. 1.

FIG. 2 illustrates the memory array 102, row and column decoders 130, 134, the data register 140, the array driver 136, program driver 138, and the control logic 128 of the flash memory 100 in greater detail. As previously discussed, the memory array 102 is divided into a plurality of memory planes. In the embodiment illustrated in FIG. 2, the memory 100 has four planes 202(0)-202(3). Each plane 202(0)-202(3) generally includes a memory array 102(0)-102(3). Row and column decoders 130(0)-130(3) and 134(0)-134(3), data registers 140(0)-140(3), program drivers 138(0)-138(3), and array drivers 136(0)-136(3) are associated with a respective memory plane 202(0)-202(3). Each of the array drivers 136(0)-136(3) is coupled to an array driver logic 214, shown in FIG. 2 as being included with the control logic 128, and coupled to the control logic 128. The array driver logic 214 provides enable signals ARDR0_EN-ARDR3_EN to the array drivers 136(0)-136(3), and the control logic 128 provides, among other conventional control signals, program and verify pulse signals PGM_PLS, VFY_PLS that control the array drivers 136(0)-136(3) during programming data to the memory planes 202(0)-202(3). The PGM_PLS, VFY_PLS signals are commonly provided to the array drivers 136(0)-136(3) receives a respective enable signal ARDR0_EN-ARDR3_EN, which can be used to individually enable the array drivers 136(0)-136(3) to respond to the PGM_PLS, VFY_PLS signals.

Data are loaded to data registers 140(0)-140(3) for programming to a respective memory plane 202(0)-202(3). As will be described in more detail below, the data loaded in a data register 140(0)-140(3) are programmed to a respective memory array 102(0)-102(3) when the respective array driver 136(0)-136(3) is enabled by the array driver logic 214 to respond to the PGM_PLS, VFY_PLS signals. Separately enabling the array drivers 136(0)-136(3) allows the use of a single control logic 128 to stagger memory operations in the memory planes 202(0)-202(3) using commonly provided PGM_PLS, VFY_PLS signals, thereby avoiding the need to have separate control logic to control operation of each memory plane 202(0)-202(3). As will be further described below, the separately enabled memory planes 202(0)-202(3) can be operated in an interleaved manner so that during the loading of program data to a data register of one memory plane, program data already loaded to the data register of another memory plane are being programmed. In this sequential multi-plane page programming operation, data loading and programming time of the memory planes 202(0)-202(3) can be overlapped without using a register, such as a cache register, in addition to the data register 140(0)-140(3), such as a cache register.

Figure 3:
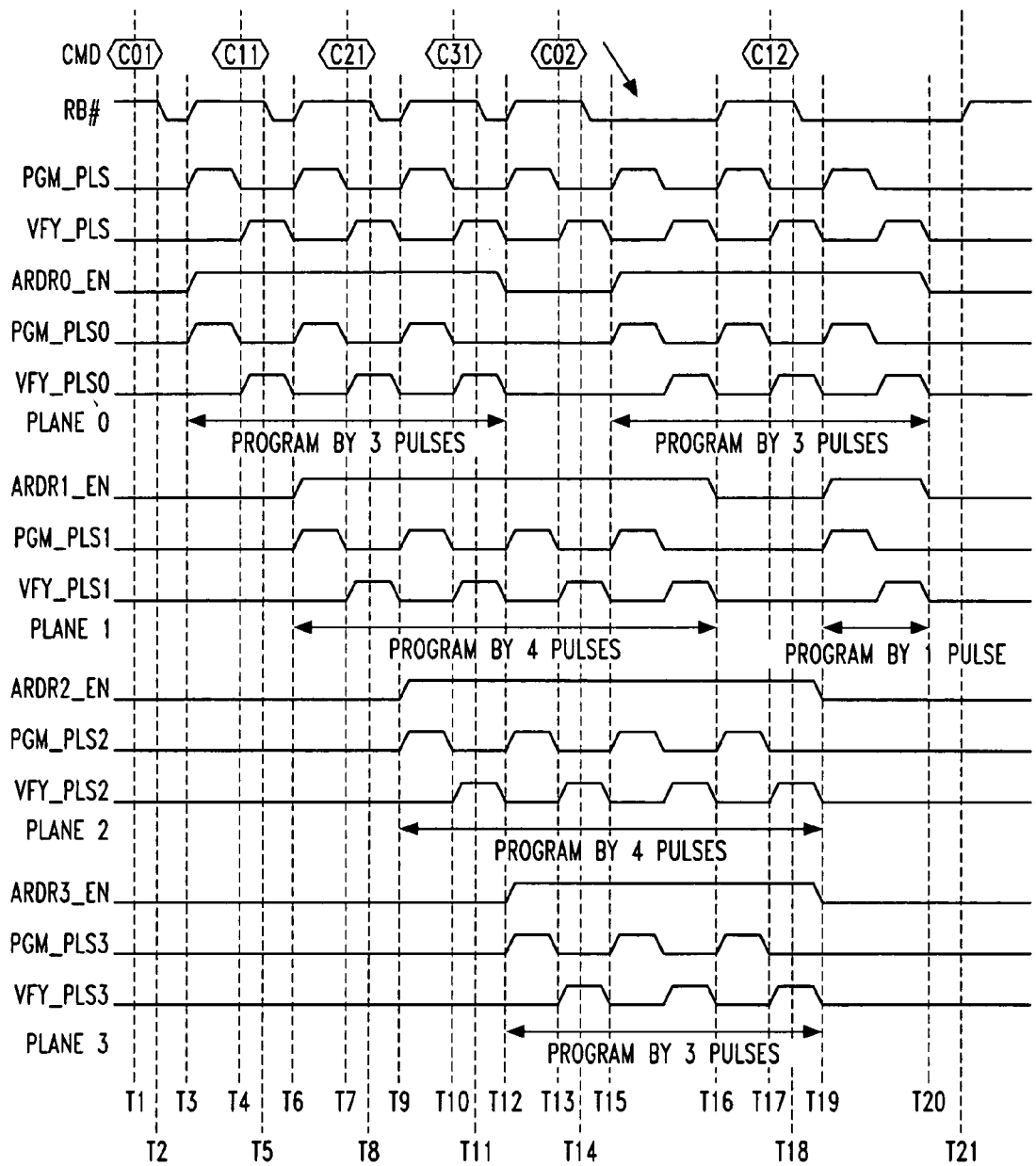
FIG. 3 is a timing diagram of various signals during programming of the multiple memory planes according to an embodiment of the invention.

FIG. 3 illustrates a timing diagram of various signals during a sequential multi-plane page programming operation in the flash memory 100 according to an embodiment of the invention. Command, address and data signals provided to the flash memory 100 during the multi-plane page programming are represented by the CMD signal in FIG. 3. For example, C01 signals represent signals providing the memory with a page program command 80H, memory addresses in memory plane 202(0) at which programming of data is to begin, sequential loading of the data to be programmed, and confirmation command 11H to begin programming of data in the memory plane 202(0) starting at the specified address. The C01, C11, C21, C31, C02, and C12 represent signals provided to the flash memory 100, as follows:

C01: 80H command, addresses for plane 202(0) for a first page program cycle, sequentially loaded program data to data register 140(0), and 11H command (i.e., end of data register load).

C11: 80H command, addresses for plane 202(1) for a first page program cycle, sequentially loaded program data to data register 140(1), and 11H command.

C21: 80H command, addresses for plane 202(2) for a first page program cycle, sequentially loaded program data to data register 140(2), and 11H command.

C31: 80H command, addresses for plane 202(3) for a first page program cycle, sequentially loaded program data to data register 140(3), and 15H command (i.e., turn-around to first memory plane).

C02: 80H command, addresses for plane 202(0) for a second page program cycle, sequentially loaded program data to data register 140(0), and 11H command.

C12: 80H command, addresses for plane 202(1) for a second page program cycle, sequentially loaded program data to data register 140(1), and 10H command (i.e., finish sequential multi-page programming).

At time T1, the command, address, data of C01 are provided to the I/O control 114 of the flash memory 100 on the device bus 116 to initiate a first data programming cycle for memory plane 202(0). Upon completion of C01 (i.e., receipt of the 11H command), the control logic 128 activates the transistor 132 to provide a LOW R/B# signal at time T2 to indicate that receipt of C01 is complete. In a conventional flash memory, the 11H command is often designated as a "dummy command" that is used to mark the end of data being provided for programming. However, in the present embodiment, the 11H command is interpreted by the control logic 128 as not only ending provision of data to be programmed, but also indicates that programming is to begin for the memory plane associated with the addresses provided prior to the data.

Also shortly after the R/B# signal is driven LOW, the control logic 128 provides program signals PGM_PLS and VFY_PLS signals to begin a programming operation and the array driver logic 214 enables the array driver 136(0) (a HIGH ARDR0_EN signal) to respond to the PGM_PLS and VFY_PLS signals. In response, the array driver 136(0) controls the program driver 138(0) to begin a program-verify pulse sequence to program the data loaded during C01 to the memory array 102(0). The data loaded to the data register 140(0) during C01 is programmed to the array 102(0) over three cycles of the program-verify pulses, shown by the PGM_PLS0, VFY_PLS0 signals in FIG. 3 between times T3-T12. The PGM_PLS0, VFY_PLS0 signals are responsive to the PGM_PLS, VFY_PLS signals provided by the control logic 128 and represent the program-verify pulses to which the array driver 136(0) responds when enabled.

Programming of the data to the memory array 102(0) is conventional, and the use of a sequence of program-verify pulses to iteratively program the data is known by those ordinarily skilled in the art. A detailed description of the programming process is not provided herein in the interest of brevity. In contrast to a conventional flash memory and conventional multi-plane page programming operations, although the PGM_PLS, VFY_PLS signals are provided by the control logic 128 to all of the array drivers 136(0)-136(3), as previously discussed, only the array driver 136(0) responds to the signals by initiating programming of data because it is the only array driver enabled by the array driver logic 128 at that time. That is, the array drivers 136(1)-136(3) also receive the PGM_PLS, VFY_PLS signals to initiate programming but are not enabled by the respective enable signal to respond, as shown in FIG. 3 by the inactive PGM_PLS1-PGM_PLS3, VFY_PLS1-VFY_PLS3 signals during times T3-T6.

At time T3, the control logic 144 deactivates the transistor 132, driving the R/B# signal HIGH to indicate that the flash memory 100 is ready to receive new command, address, and data. At time T4, command, address, data of C11 are provided to initiate a first data programming cycle for memory plane 202(1). At the completion of providing C11, the control logic 128 drives the R/B# signal LOW at time T5 to indicate that the command, address, and data of C11 has been successfully received and further drives the R/B# signal HIGH again at time T6 to indicate that the flash memory 100 is ready to receive a new command. Shortly after the R/B# is driven LOW at time T5, the array driver logic 214 enables the array driver 136(1) (with a HIGH ARDR1_EN signal) to respond to the PGM_PLS, VFY_PLS signals and begin programming data loaded to the data register 138(1) during C11 to the memory array 102(1). With the array driver logic 214 enabled, the PGM_PLS and VFY_PLS signals provided by the control logic 128 are received by the array driver 136(1), and in response, controls the program driver 138(1) to begin a program-verify pulse sequence to program the data loaded during C11 to the memory array 102(1).

The data loaded to the data register 140(1) during C11 is programmed to the array 102(1) over four cycles of the program-verify pulses, shown in FIG. 3 as active PGM_PLS1, VFY_PLS1 signals between time T6-T16. As known, the difference in the number of program-verify pulse cycles for programming data between memory planes 202(0) and 202(1) can be due to the difference in the amount of data programmed to the memory planes 202(0) and 202(1). The difference in programming time between memory planes 202(0) and 202(1) illustrated in FIG. 3 has been provided by way of example to illustrate operation for the case where there are differences in programming time between various memory planes.

As previously discussed, data are programmed to the memory array 102(0) during the time the command, address, data of C11 is being provided to the flash memory 100. As a result, a first program-verify pulse cycle (between times T3-T6) is overlapped with provision of the command and address, and data loading of C11. As will be further explained below, the second and third program-verify-cycles (between times T6-T9 and T9-T12, respectively) will also be overlapped with provision of command, address, and data of C21 and C31 to "hide" the program time of data to the memory plane 202(0). Moreover, the array driver 136(1) is enabled at a time (i.e., time T6) so that the common PGM_PLS and VFY_PLS provided by the control logic 128 can be used for the program-verify pulse sequence to program the data to the array 102(1). As previously discussed, using the common PGM_PLS and VFY_PLS for programming avoids the need for having separate control logic for each of the memory planes 202(0)-202(3).

Data is programmed to memory planes 202(2) and 202(3) by providing command, address, and data by C21 at time T7 and by C31 at time T10, respectively. Specifically, for memory plane 202(2), the R/B# signal is strobed LOW at time T8 and the array driver 136(2) is enabled (by a HIGH ARDR2_EN signal) at time T9 to respond to the common PGM_PLS and VFY_PLS provided by the control logic 128. In response, the array driver 136(2) controls the program driver 138(2) to begin program-verify pulse cycles to program the data loaded to the data register 140(2) during C21. As shown by active PGM_PLS2, VFY_PLS2 signals in FIG. 3, the program time for the data to memory array 102(2) is four program-verify pulse cycles between times T9-T19. For memory plane 202(3), C31 is ended with a 15H "turn-around" command that indicates to the flash memory 100 that the next command, address, and data that will be provided is for a memory operation in the first memory plane 202(0). The R/B# signal is strobed LOW between times T11-T12, and the array driver 136(2) is enabled (by a HIGH ARDR3_EN signal) to respond to the common PGM_PLS and VFY_PLS provided by the control logic 128. In response, the array driver 136(3) controls the program driver 138(3) to begin program-verify pulse cycles to program the data loaded to the data register 140(3) during C31. As shown by active PGM_PLS3, VFY_PLS3 signals in FIG. 3, the program time for the data to memory array 102(2) is three program-verify pulse cycles between times T12-T19.

A second page program cycle for the memory plane 202(0) is initiated by provided command, address, and data of C02 at time T13. At the completion of C02, the control logic 128 drives the R/B# LOW at time T14, and shortly thereafter, the array driver logic 214 enables the array driver 136(0) (by a HIGH ARDR0_EN signal). The array driver 136(0) was disabled earlier at time T12 when programming of the data from C01 was completed. Enabling the array driver 136(0) at time T15 allows it to respond to the common PGM_PLS and VFY_PLS signals from the control logic 128 to control the program driver 138(0) to begin program-verify pulse cycles to program data loaded to the data register 140(0) during C02 to the memory array 102(0).

The R/B# signal that is driven LOW at time T14 is not driven HIGH by the control logic 128 until time T16 because data is still being programmed to the next memory plane 202(1) between times T15-T16. Upon completion of programming to the memory plane 202(1), the array driver 136(1) is disabled by driving the ARDR1_EN signal LOW. The R/B# signal is driven HIGH again at time T16, as previously discussed, to indicate that the flash memory 100 is ready to receive command, address, and data for programming to the next memory plane.

At time T17, command, address, and data for a second page programming cycle to the memory plane 202(1) is provided by C12. As previously discussed, the confirmation command provided after the data to be programmed has been loaded to the data register 140(1) is an end of page programming command 10H (in contrast to 11H). The 10H command indicates that programming to the last memory plane identified by the address represents completion of the sequential multi-plane programming operation. Upon completion of C12, the R/B# signal is driven LOW at time T18. Shortly thereafter, the array driver 136(1) is enabled (by a HIGH ARDR1_EN signal) to receive the common PGM_PLS and VFY_PLS signals to control the program driver 138(1) to begin programming data. As shown in FIG. 3, only one program-verify pulse cycle between times T19-T20 is needed to program the data of C12 to the array 102(1). The R/B# signal remains LOW in response to the 11H command of C12 until time T21, which is following a clean-up sequence (not shown in FIG. 3) during which the voltage of wordlines and bitlines of the memory arrays 102(0)-102(3) is recovered and high-voltage used for programming is discharged.

The previous example described with reference to the timing diagram of FIG. 3 illustrates the sequential multi-page programming operation in which providing command and address, data loading, and programming for the memory planes 202(0)-202(3) are overlapped. Common control signals, represented in FIG. 3 as PGM_PLS and VFY_PLS signals, provided by the control logic 128 can be used to stagger and interleave programming of the memory planes 202(0)-202(3) by separately enabling the array drivers 136(0)-136(3) to receive and respond to the control signals.

Figure 4:
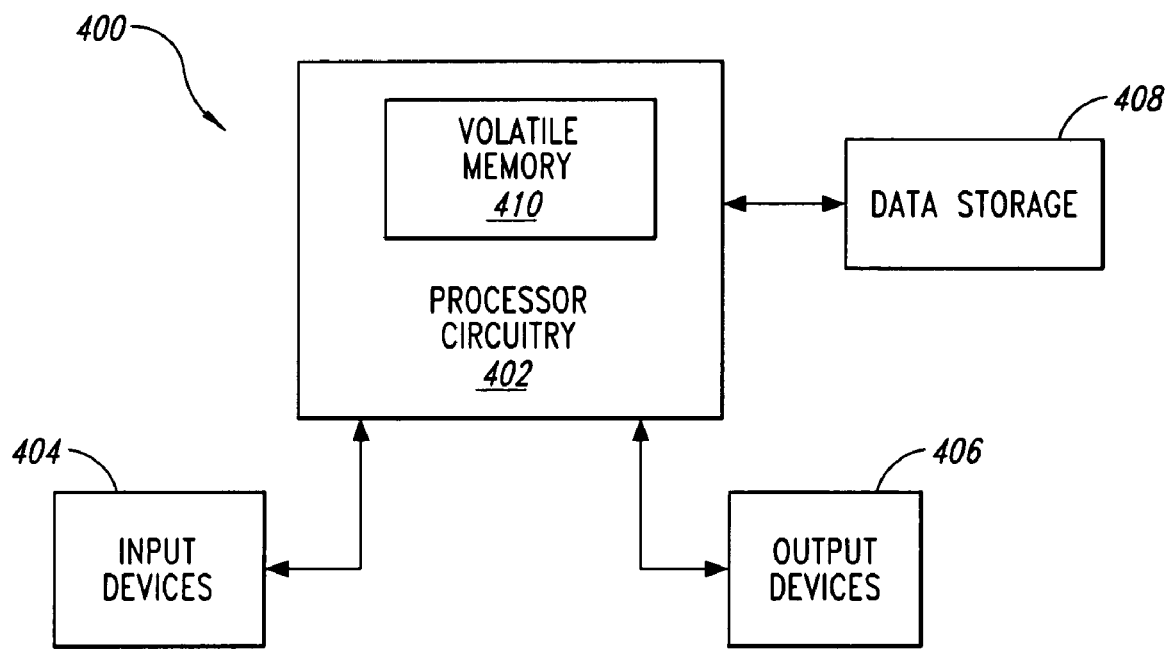
FIG. 4 is a processor-based system according to another embodiment of the invention.

FIG. 4 is a block diagram of a processor-based system 400. The processor-based system 400 may be a computer system, a process control system, an embedded system, or any other system employing a processor and associated memory. The processor-based system includes processor circuitry 402 having volatile memory 410. The processor circuitry 402 is coupled through address, data, and control buses to the volatile memory 410 to provide for writing data to and reading data from the volatile memory 410. The processor circuitry 402 includes circuitry for performing various processing functions, such as executing specific software to perform specific calculations or tasks. In some embodiments, the processor-based system 400 also includes one or more input devices 404 coupled to the processor circuitry 402 to allow an operator to interface with the processor-based system 400. Examples of input devices 404 include keypads, touch screens, and scroll wheels. The processor-based system 400 also includes one or more output devices 406 coupled to the processor circuitry 402 to provide output information to the operator. In one embodiment, the output device 406 is a visual display providing visual information to the operator. Data storage 408 is also coupled to the processor circuitry 402 to store data that is to be retained even when power is not supplied to the processor-based system 400 or to the data storage 408. The flash memory 100, or another embodiment of a flash memory according to the present invention, can be used for the data storage 408.

Although previously described with reference to programming operations, the interleaved operation of the separate memory planes can be used during read and erase operations as well. For example, with respect to a read operation, the provision of commands and addresses to one memory plane can be overlapped with reading data from another memory plane. Similarly, with respect to an erase operation, provision of command and addresses of memory blocks of one memory pane to be erased can be overlapped with the erase operation of another memory plane.

From the foregoing it will be appreciated that, although specific embodiments of the invention have been described herein for purposes of illustration, various modifications may be made without deviating from the spirit and scope of the invention. For example, previously described embodiments of the invention are directed to a flash memory without cache registers. As previously discussed, including cache registers significantly increases layout area. However, although the previously described embodiments utilize interleaved operation of multiple planes without cache registers, in alternative embodiments, cache registers are included in the memory and operation thereof is combined with interleaved operation of multiple memory planes. Accordingly, the invention is not limited except as by the appended claims.

What is claimed is:

1. A flash memory receiving control signals, and command and address signals, the flash memory comprising:
    an array of flash memory cells having a plurality of memory planes;
    a state machine operable to generate memory control signals for executing memory operations for the plurality of memory planes in response to the control, command and address signals;
    a plurality of memory plane control circuits, each control circuit associated with a respective one of the plurality of memory planes and coupled to the state machine to receive the memory control signals, each control circuit operable to control execution of memory operations for the respective memory plane in response to the control signals from the state machine when enabled by a respective active enable signal;
    a plurality of data registers, each data register associated with a respective one of the plurality of memory planes; and
    control circuit enable logic coupled to the state machine and coupled to the plurality of memory plane control circuits, the control circuit enable logic operable to generate respective active enable signals for the plurality of memory plane control circuits to initiate the memory operation for a first memory plane at a first time and initiate the memory operation for a second memory plane at a second time, the second time subsequent to the first time and during execution of the memory operation for the first memory plane.

2. The flash memory of claim 1 wherein the state machine comprises a state machine operable to generate memory control signals including control signals that repeat periodically to execute the memory operations.

3. The flash memory of claim 2 wherein the control circuit enable logic comprises control circuit enable logic operable to generate respective active enable signals for the plurality of memory plane control circuits to initiate the memory operation in synchronicity with the periodically repeating control signals.

4. The flash memory of claim 1 wherein each of the memory plane control circuit includes a program driver operable to program data to memory cells of the respective memory plane.

5. The flash memory of claim 1 wherein the control circuit enable logic comprises control circuit enable logic operable to generate respective active enable signals for the plurality of memory plane control circuits to initiate at least one of a program operation, read operation, and erase operation.

6. A processor-based system, comprising:
    a volatile memory operable to store data;
    a processor coupled to the memory and operable to process data; and
    a data storage coupled to the processor and operable to store data, the data storage including a flash memory receiving control signals, and command and address signals, the flash memory comprising:
        an array of flash memory cells having a plurality of memory planes;
        a state machine operable to generate memory control signals for executing memory operations for the plurality of memory planes in response to the control, command and address signals;
        a plurality of memory plane control circuits, each control circuit associated with a respective one of the plurality of memory planes and coupled to the state machine to receive the memory control signals, each control circuit operable to control execution of memory operations for the respective memory plane in response to the control signals from the state machine when enabled by a respective active enable signal;
        a plurality of data registers, each data register associated with a respective one of the plurality of memory planes; and
        control circuit enable logic coupled to the state machine and coupled to the plurality of memory plane control circuits, the control circuit enable logic operable to generate respective active enable signals for the plurality of memory plane control circuits to initiate the memory operation for a first memory plane at a first time and initiate the memory operation for a second memory plane at a second time, the second time subsequent to the first time and during execution of the memory operation for the first memory plane.

7. The processor-based system of claim 6 wherein the state machine of the flash memory comprises a state machine operable to generate memory control signals including control signals that repeat periodically to execute the memory operations.

8. The processor-based system of claim 7 wherein the control circuit enable logic of the flash memory comprises control circuit enable logic operable to generate respective active enable signals for the plurality of memory plane control circuits to initiate the memory operation in synchronicity with the periodically repeating control signals.

9. The processor-based system of claim 6 wherein each of the memory plane control circuits of the flash memory includes a program driver operable to program data to memory cells of the respective memory plane.

10. The processor-based system of claim 6 wherein the control circuit enable logic of the flash memory comprises control circuit enable logic operable to generate respective active enable signals for the plurality of memory plane control circuits to initiate at least one of a program operation, read operation, and erase operation.

11. A flash memory receiving control signals, and command and address signals, the flash memory comprising:
   an array of flash memory cells having a plurality of memory planes;
   a state machine operable to generate memory control signals for executing memory operations for the plurality of memory planes in response to the control, command and address signals;
   a plurality of memory plane control circuits, each control circuit associated with a respective one of the plurality of memory planes and having a program driver operable to program data to memory cells of the respective memory plane, the plurality of control circuits coupled to the state machine to receive the memory control signals and operable to control execution of memory operations for the respective memory plane in response to the control signals from the state machine when enabled by a respective active enable signal; and
   control circuit enable logic coupled to the state machine and coupled to the plurality of memory plane control circuits, the control circuit enable logic operable to generate respective active enable signals for the plurality of memory plane control circuits to initiate the memory operation for a first memory plane at a first time and initiate the memory operation for a second memory plane at a second time, the second time subsequent to the first time and during execution of the memory operation for the first memory plane.

12. The flash memory of claim 11 wherein the state machine comprises a state machine operable to generate memory control signals including control signals that repeat periodically to execute the memory operations.

13. The flash memory of claim 12 wherein the control circuit enable logic comprises control circuit enable logic operable to generate respective active enable signals for the plurality of memory plane control circuits to initiate the memory operation in synchronicity with the periodically repeating control signals.

14. The flash memory of claim 11 wherein the control circuit enable logic comprises control circuit enable logic operable to generate respective active enable signals for the plurality of memory plane control circuits to initiate at least one of a program operation, read operation, and erase operation.

15. A processor-based system, comprising:
   a volatile memory operable to store data;
   a processor coupled to the memory and operable to process data; and
   a data storage coupled to the processor and operable to store data, the data storage including a flash memory receiving control signals, and command and address signals, the flash memory comprising:
      an array of flash memory cells having a plurality of memory planes;
      a state machine operable to generate memory control signals for executing memory operations for the plurality of memory planes in response to the control, command and address signals;
      a plurality of memory plane control circuits, each control circuit associated with a respective one of the plurality of memory planes and having a program driver operable to program data to memory cells of the respective memory plane, the plurality of control circuits coupled to the state machine to receive the memory control signals and operable to control execution of memory operations for the respective memory plane in response to the control signals from the state machine when enabled by a respective active enable signal; and
      control circuit enable logic coupled to the state machine and coupled to the plurality of memory plane control circuits, the control circuit enable logic operable to generate respective active enable signals for the plurality of memory plane control circuits to initiate the memory operation for a first memory plane at a first time and initiate the memory operation for a second memory plane at a second time, the second time subsequent to the first time and during execution of the memory operation for the first memory plane.

16. The processor-based system of claim 15 wherein the state machine of the flash memory comprises a state machine operable to generate memory control signals including control signals that repeat periodically to execute the memory operations.

17. The processor-based system of claim 16 wherein the control circuit enable logic of the flash memory comprises control circuit enable logic operable to generate respective active enable signals for the plurality of memory plane control circuits to initiate the memory operation in synchronicity with the periodically repeating control signals.

18. The processor-based system of claim 15 wherein the control circuit enable logic of the flash memory comprises control circuit enable logic operable to generate respective active enable signals for the plurality of memory plane control circuits to initiate at least one of a program operation, read operation, and erase operation.

* * * * *